(12) United States Patent
Ihms

(10) Patent No.: US 12,284,769 B2
(45) Date of Patent: Apr. 22, 2025

(54) CONFORMAL COATING BLOCKAGE BY SURFACE-MOUNT TECHNOLOGY SOLDER FEATURES

(71) Applicant: BorgWarner US Technologies LLC, Wilmington, DE (US)

(72) Inventor: David W. Ihms, Russiaville, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 722 days.

(21) Appl. No.: 16/366,909

(22) Filed: Mar. 27, 2019

(65) Prior Publication Data

US 2020/0315030 A1 Oct. 1, 2020

(51) Int. Cl.
| | |
|---|---|
| *B23K 1/008* | (2006.01) |
| *B23K 1/00* | (2006.01) |
| *H05K 1/18* | (2006.01) |
| *H05K 3/28* | (2006.01) |
| *H05K 3/34* | (2006.01) |
| *B23K 101/42* | (2006.01) |

(52) U.S. Cl.
CPC ......... *H05K 3/3436* (2013.01); *B23K 1/0008* (2013.01); *H05K 1/181* (2013.01); *H05K 3/28* (2013.01); *H05K 3/3452* (2013.01); *B23K 2101/42* (2018.08); *H05K 2201/10636* (2013.01)

(58) Field of Classification Search
CPC ................ B23K 1/0008; B23K 1/0016; H05K 2201/09872; H05K 3/284; H05K 3/3452
See application file for complete search history.

(56) References Cited

U.S. PATENT DOCUMENTS

| | | | | |
|---|---|---|---|---|
| 5,266,349 A | | 11/1993 | Bok | |
| 5,447,886 A | * | 9/1995 | Rai | H01L 24/81 |
| | | | | 438/125 |
| 5,704,116 A | * | 1/1998 | Gamota | H05K 3/3489 |
| | | | | 29/841 |
| 5,930,889 A | * | 8/1999 | Klein | H05K 3/3436 |
| | | | | 29/840 |

(Continued)

FOREIGN PATENT DOCUMENTS

JP 2015103782 A 6/2015

OTHER PUBLICATIONS

Nick Naumovic, Easy Techniques To Abate Conformal Coating Wicking, http://blog.humiseal.com/easy-techniques-to-abate-conformal-coating-wicking, Jan. 11, 2017.

*Primary Examiner* — Erin B Saad
*Assistant Examiner* — Carlos J Gamino
(74) *Attorney, Agent, or Firm* — Joshua M. Haines; Bookoff McAndrews, PLLC

(57) ABSTRACT

A conformal coating control method includes arranging at least one conformal control surface feature on a surface of a printed circuit board proximate perimeter pads of an integrated circuit. The method also includes soldering, to the printed circuit board, the integrated circuit. The method also includes applying a conformal coating material to the printed circuit board, wherein the conformal coating material is at least partially restricted from flowing between the integrated circuit and the printed circuit board by solder flux residue accumulated proximate the conformal control surface feature.

11 Claims, 5 Drawing Sheets

(56) References Cited

U.S. PATENT DOCUMENTS

| | | | | |
|---|---|---|---|---|
| 5,936,309 A * | 8/1999 | Kim | H05K 3/3436 | 257/779 |
| 5,985,043 A * | 11/1999 | Zhou | B23K 35/025 | 252/514 |
| 6,059,172 A * | 5/2000 | Chapman | H01L 23/49816 | 228/180.22 |
| 6,316,736 B1 * | 11/2001 | Jairazbhoy | H05K 1/111 | 174/260 |
| 6,773,957 B2 * | 8/2004 | Farnworth | G03F 7/70416 | 438/107 |
| 6,824,041 B2 * | 11/2004 | Grieder | B23K 1/0016 | 257/738 |
| 7,028,867 B2 | 4/2006 | Acum et al. | | |
| 7,511,965 B2 * | 3/2009 | Fujii | H05K 3/3452 | 361/767 |
| 8,319,114 B2 * | 11/2012 | Cheng | H05K 3/3442 | 174/262 |
| 9,441,119 B2 | 9/2016 | Kalyankar et al. | | |
| 10,849,224 B1 * | 11/2020 | Hayashi | H05K 3/3452 | |
| 11,277,919 B2 * | 3/2022 | Araki | H05K 3/28 | |
| 2003/0184986 A1 * | 10/2003 | Soga | H05K 3/3452 | 361/767 |
| 2005/0260844 A1 | 11/2005 | Kwak et al. | | |
| 2007/0145101 A1 * | 6/2007 | Kataoka | H05K 3/3442 | 228/101 |
| 2008/0202804 A1 * | 8/2008 | Fakutomi | H05K 3/363 | 174/267 |
| 2008/0216704 A1 | 9/2008 | Eisenbeis et al. | | |
| 2010/0101845 A1 * | 4/2010 | Kishi | H01L 24/29 | 174/259 |
| 2010/0295177 A1 * | 11/2010 | Ouchi | H05K 3/3436 | 257/737 |
| 2011/0221075 A1 * | 9/2011 | Meura | B23K 1/0016 | 228/176 |
| 2012/0098126 A1 * | 4/2012 | Iwasaki | H01L 24/14 | 257/737 |
| 2013/0037957 A1 * | 2/2013 | Takahashi | B23K 35/3612 | 257/772 |
| 2013/0098506 A1 * | 4/2013 | Toyoda | B23K 35/3616 | 148/24 |
| 2013/0107483 A1 | 5/2013 | Jiang et al. | | |
| 2013/0133193 A1 * | 5/2013 | Hsu | H05K 3/3436 | 29/840 |
| 2017/0287823 A1 * | 10/2017 | Adachi | H01L 23/49811 | |
| 2017/0373050 A1 * | 12/2017 | Shao | H01L 24/09 | |
| 2018/0070456 A1 | 3/2018 | Dobriyal et al. | | |
| 2018/0093338 A1 * | 4/2018 | Edlinger | B23K 1/203 | |
| 2018/0332699 A1 * | 11/2018 | Yang | H05K 1/0209 | |
| 2018/0350712 A1 * | 12/2018 | Thanu | H01L 23/3675 | |

\* cited by examiner

CONFORMAL COATING BLOCKAGE BY SURFACE-MOUNT TECHNOLOGY SOLDER FEATURES

TECHNICAL FIELD

This disclosure relates to printed circuit boards, and in particular, to systems and methods for blocking conformal coating using surface-mount technology solder features.

BACKGROUND

Surface-mount devices, such as integrated circuits (IC) (e.g., analog signal ICs, digital signal ICs, or mixed signal ICs), typically comprise a set of electronic components, such as transistors or other suitable components, inseparably integrated on a relatively small portion of semiconductor material (e.g., silicon or other suitable material). Modern ICs may integrate millions or billions of electronic components and may be used in various applications, such as desktop computers, laptop computers, mobile computing devices, tablet computing devices, home appliances, stereos, medical devices, and a plurality of other electronic devices.

In such applications, an IC is typically connected, using surface-mount technology (SMT) (e.g., solder or other thermally conductive material applied to conductive pads disposed on a side of the IC facing the printed circuit board), to a printed circuit board (PCB) substrate, which electrically connects other ICs and electronic components on the PCB. Typically, solder and flux (e.g., a paste that promotes solder flow) are applied to the PCB (e.g., using a printing process or other suitable manufacturing process) to secure and electrically connect the IC, and other electronic components, to the PCB (e.g., typically referred to as a PCB assembly (PCBA) when the ICs and electronic components are secured and electrically connected to the PCB).

Typically, a conformal coating material is applied to the PCB after the IC and/or other electronic components are soldered to the PCB. The conformal coating material typically includes polymers and other suitable material. The conformal coating material, when applied to the PCB, typically forms a thin layer that protects components of the PCB from moisture, dust, chemicals, and/or surface electrical changes. However, during application of the conformal coating material (e.g., such as a low viscosity conformal coating material), some of the conforming coating material may flow between the IC, or other electronic components, and the PCB. This may cause accelerated solder fatigue to solder connections that connect the IC, or other electronic components, to the PCB.

SUMMARY

This disclosure relates generally to conformal coating control systems and methods.

An aspect of the disclosed embodiments is a conformal coating control method. The method includes arranging at least one conformal control surface feature on a surface of a printed circuit board proximate perimeter pads of an integrated circuit. The method also includes soldering, to the printed circuit board, the integrated circuit. The method also includes applying a conformal coating material to the printed circuit board, wherein the conformal coating material is at least partially restricted from flowing between the integrated circuit and the printed circuit board by solder flux residue accumulated proximate the conformal control surface feature.

Another aspect of the disclosed embodiments is a system for conformal coating control. The system includes a printed circuit board and an integrated circuit disposed on a surface of the printed circuit board, wherein a solder mask material is disposed on the surface of the printed circuit board proximate perimeter pads of the integrated circuit. The system also includes at least one solderable member disposed on the printed circuit board proximate the integrated circuit. The system also includes a conformal coating material that is applied to the printed circuit board, wherein the conformal coating material is at least partially restricted from flowing between the integrated circuit and the printed circuit board by solder flux residue accumulated proximate of the solder mask material and the at least one solderable member.

Another aspect of the disclosed embodiments is a conformal coating control method. The method includes applying a solder mask material into channels on a printed circuit board defined by an integrated circuit. The method also includes arranging, on the printed circuit board and proximate a corner of the integrated circuit, a solderable member. The method also includes soldering, to the printed circuit board, the integrated circuit, wherein soldering the integrated circuit to the printed circuit board causes solder flux residue to accumulate proximate the solder mask material and the solderable member. The method also includes applying a conformal coating material to the printed circuit board, wherein the conformal coating material is at least partially restricted, by the solder flux residue, from flowing between the integrated circuit and the printed circuit board.

These and other aspects of the present disclosure are provided in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
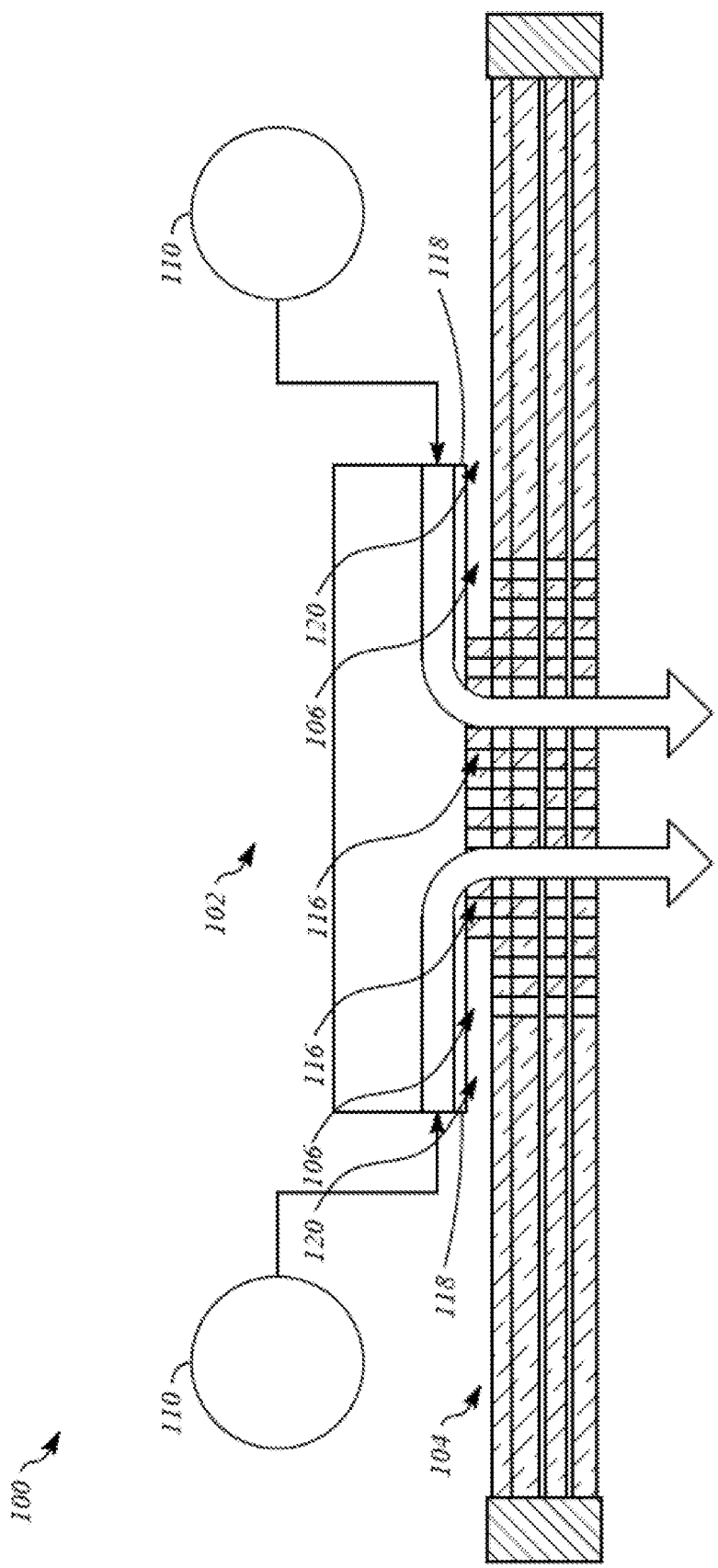
FIG. 1 generally illustrates a printed circuit board assembly according to the principles of the present disclosure.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, surface-mount devices, such as integrated circuits (IC) (e.g., analog signal ICs, digital signal ICs, or mixed signal ICs), typically comprise a set of electronic components, such as transistors or other suitable components, inseparably integrated on a relatively small portion of semiconductor material (e.g., silicon or other suitable material). ICs may include microprocessors, microcontrollers, memory chips, application-specific integrated circuits (ASICs), field-programmable gate arrays (FPGAs), sensors, power management circuits, operation amplifiers, analog-to-digital converters, digital-to-analog converters, and the like. In some embodiments, the ICs may include a flat no-leads package, such as a quad-flat no-leads package, a dual-flat no-leads package, or other suitable no-leads package. Modern ICs may integrate millions or billions of electronic components and may be used in various applications, such as desktop computers, laptop computers, mobile computing devices, tablet computing devices, home appliances, stereos, medical devices, and a plurality of other electronic devices.

An IC is typically connected, using surface-mount technology (e.g., solder or other thermally conductive material applied to conductive pads disposed on a side of the IC facing the printed circuit board), to the printed circuit board (PCB) substrate, which electrically connects other ICs and electronic components (e.g., resistors, capacitors, indictors, transformers, power resistors, large area passives, and the like) the PCB. For example, one or more leads of the IC may be soldered to the substrate to electrically connect the IC to the other ICs and electronic components on the PCB and/or to one another. The solder, such as a lead alloy solder or other suitable solder, provides a conductive path for electrons to flow to and from the IC via the substrate. Typically, solder and flux (e.g., a paste that promotes solder flow) are applied to the PCB (e.g., using a dipping process or other suitable manufacturing process) to secure and electrically connect the IC, and other electronic components, to the PCB (e.g., typically referred to as a PCB assembly (PCBA) when the ICs and electronic components are secured and electrically connected to the PCB).

Typically, a conformal coating material is applied to the PCB after the IC and/or other electronic components are soldered to the PCB. The conformal coating material typically includes acrylic material, epoxy material, polyurethane material, silicone material, fluorinated poly-para-xylylene material, non-fluorinated poly-para-xylylene material, amorphous fluoropolymer material, or other suitable material. The conformal coating material may be applied to the PCB by brushing the conformal coating material onto the PCB, by spraying the conformal coating material onto the PCB, by dispensing the conformal coating material onto the PCB, by dipping the PCB in the conformal coating material, or by other suitable application processes. The conformal coating material, when applied to the PCB, typically forms a thin layer (e.g., 25 micrometers to 250 micrometers) that conforms to contours of the PCB. The conformal coating material protects components (e.g., such as ICs and other electronic components) of the PCB from moisture, dust, chemicals, and/or surface electrical changes.

However, during application of the conformal coating material, some of the conforming coating material may flow between the IC, or other electronic components, and the PCB. For example, a stand-off gap may be defined between a surface of the IC facing the PCB and the PCB. The conformal coating material may flow into the stand-off gap during application of the conforming coating material to the PCB. This may cause accelerated solder fatigue to solder connections that connect the IC, or other electronic components, to the PCB. Accordingly, systems and methods, such as those described herein, that control the flow of conformal coating material during the application of the conformal coating material to the PCB, may be desirable. In some embodiments, as will be described, the system and methods disclosed herein include may include using surface features on the PCB that cause solder paste flux residue to accumulate proximate the IC and/or other electronic components. The solder paste flux residue may restrict the flow of conformal coating material from flowing between the IC and/or other electronic components, during application of the conformal coating material to the PCB.

FIG. 1 generally illustrates a printed circuit board assembly (PCBA) 100 according to the principles of the present disclosure. The PCBA 100 may be used in any suitable application, such as a desktop computer, a laptop computer, a mobile computing device, a tablet computing device, a home appliance, a stereo, a medical device, or any other suitable electrical device. Additionally, or alternatively, the PCBA 100 may interact with a plurality of other PCBAs.

The PCBA 100 includes an integrated circuit (IC) 102 and a printed circuit board (PCB) 104. The IC 102 may include a plurality of electronic components inseparably integrated and/or disposed on a segment of semiconductor material, such as silicon or other suitable semiconductor material. The IC 102 may comprise a microprocessor, a microcontroller, a memory chip, an application-specific integrated circuit (ASIC), a field-programmable gate array (FPGA), a sensor, a power management circuit, an operation amplifier, an analog-to-digital converter, a digital-to-analog converter, or other suitable IC. Additionally, or alternatively, the IC 102 may comprise an analog signal IC, a digital signal IC, or a mixed signal IC. In some embodiments, the IC 102 may include a flat no-leads package, such as a quad-flat no-leads package, a dual-flat no-leads package, or other suitable no-leads package. In some embodiments, the IC 102 may include a 5 millimeter by 5 millimeter quad-flat no-leads package, a 9 millimeter by 9 millimeter quad-flat no-leads package, 10 millimeter by 10 millimeter quad-flat no-leads package, or other suitable quad-flat no-leads package.

The IC 102 may include an exposed pad disposed on a bottom surface of the IC 102 (e.g., a surface that faces the PCB 104). The exposed pad may include a plurality of leads adapted to be electrically connected to the PCB 104. For example, thermal conductive material such as solder, may be applied between a respective lead and a portion of a substrate on the PCB 104. It should be understood that while only the IC 102 is described herein, the principles of the present disclosure apply to any number of ICs and any suitable electronic components. For example, while not illustrated, the PCBA 100 may include one or more power resistors, one or more large area passives, other suitable electronic components, or a combination thereof.

The PCB 104 may be adapted to mechanically support the IC 102 and/or other ICs and electronic components, and to electrically connect such components. The PCB 104 may include, as described, substrates, pads, and other features that may be etched into one or more layers of conductive material, such as copper or other suitable conductive material. The layers of conductive material of the PCB 104 may be laminated onto or sandwiched between layers of non-conductive material.

In some embodiments, the PCBA 100 includes one or more stand-off gaps 106. The stand-off gaps 106 may be defined by a surface of the IC 102 that faces the PCB 104 and a surface of the PCB 104 that faces the IC 102. The PCBA 100 may include one or more power sources 110. The power sources 110 may include current sources, voltage sources, or other suitable power source. The power sources 110 may include a power circuit comprising a voltage source, one or more resistors, one or more capacitors, and/or one or more other suitable electronic components. In some embodiments, the PCBA 100 includes a high side power source 110 and a low side power source 110, however, the PCBA 100 may omit either of the high side power source 110 or the low side power source 110. When power (e.g., voltage and/or current) is supplied by one of the power sources 110, the power flows through the components of the IC 102 and into the substrate of the PCB 104 via the solder connections between the IC 102 and the substrate of the PCB 104.

In some embodiments, the PCBA 100 may include additional or few components than illustrated and/or described herein. For example, the PCBA 100 may include a pedestal (e.g., a heat sink) and a PCBA case or housing. The PCBA housing may be configured to house or enclose the IC 102, PCB 104, and/or the pedestal. The pedestal may be disposed on a side of the PCB 104 opposite the IC 102. The PCB 104 may be attached to the pedestal using a suitable thermal interface material (e.g., thermal glue or other thermally conductive material). The pedestal may include a heat sink configured to draw heat generated by the IC 102 away from the IC 102.

A conformal coating material may be applied to the PCB 104 after the IC 102 and/or other electronic components are connected to the PCB 104 using solder or other suitable thermal conductive material. The conformal coating material includes acrylic material, epoxy material, polyurethane material, silicone material, fluorinated poly-para-xylylene material, non-fluorinated poly-para-xylylene material, amorphous fluoropolymer material, or other suitable material. The conformal coating material may be applied to the PCB 104 by brushing the conformal coating material onto the PCB 104, by spraying the conformal coating material onto the PCB 104, by dispensing the conformal coating material onto the PCB 104, by dipping the PCB 104 in the conformal coating material, or by other suitable application processes. The conformal coating material, when applied to the PCB 104, forms a thin layer (e.g., 25 micrometers to 250 micrometers) that conforms to contours of the PCB 104. As described, the conformal coating material protects the IC 102 and/or other electronic components connected of the PCB 104 from moisture, dust, chemicals, other contaminants, changes in temperature, and the like. As will be described, the PCB 104 may include one or more conformal control surface features configured to restrict or control flow of the conformal coating material proximate the IC 102 and/or other electronic components.

Figure 2:
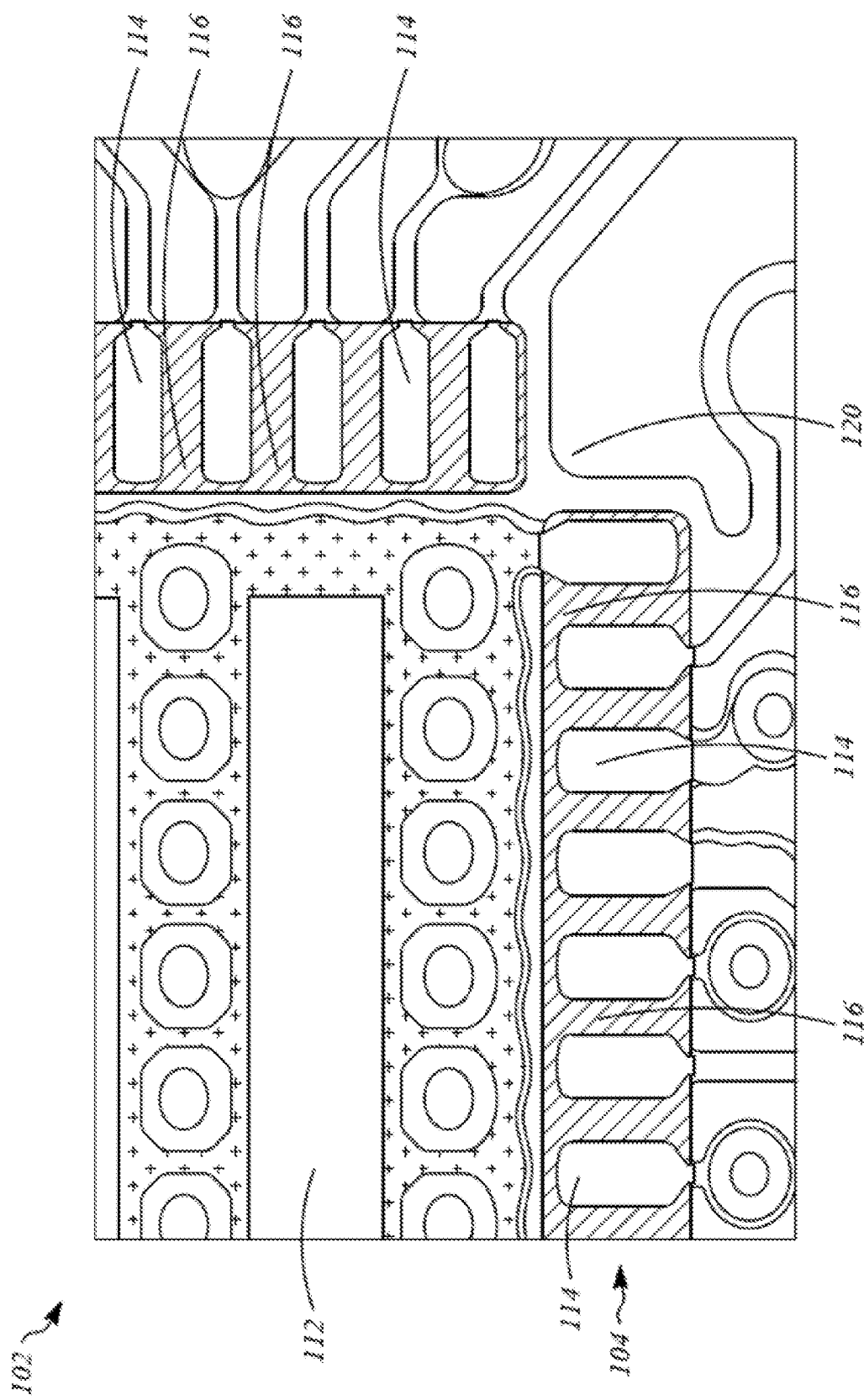
FIG. 2 generally illustrates a cutaway view between an integrated circuit and a printed circuit board according to the principles of the present disclosure.

FIG. 2 generally illustrates a cutaway view between an integrated circuit and a printed circuit board (PCB) 104 according to the principles of the present disclosure. The IC 102 may be connected, via solder or other suitable thermal conductive material, to the PCB 104. It should be understood that, while only IC 102 is described as being connected to the PCB 104, additional ICs and/or other electronic components may be connected to the PCB 104. Accordingly, the principles of the present disclosure described herein apply to any suitable electronic component connected to the PCB 104.

The IC 102 may include exposed pad 112 disposed on the surface of the IC 102 facing the PCB 104 adapted to be connected, via solder or other thermal conductive material, to a corresponding pad or a portion of a substrate on the PCB 104. In some embodiments, the IC 102 includes a plurality of perimeter pads 114 disposed along a perimeter of the IC 102. The perimeter pads 114 are adapted to be connected, via solder or other thermal conductive material, to corresponding pads or corresponding portions of the substrate of the PCB 104. The perimeter pads 114 may include any suitable dimensions. For example, a perimeter pad 114 may include a 0.25 millimeter width and a 0.69 millimeter length, 0.20 millimeter width and a 0.73 millimeter length, or any suitable dimensions.

The perimeter pads 114 define channels 116 between the IC 102 and the PCB 104. The channels 116 may include any suitable dimensions. For example, the channels 116 may include a 0.25 millimeter width, 0.30 millimeter width, or any other suitable dimension. As described, the exposed pad 112 and/or the perimeter pads 114 define the stand-off gap 106 between the IC 102 and the PCB 104. The IC 102 includes one or more corners 118 (e.g., four corners or any suitable number of corners corresponding to a shape of the IC 102), as is illustrated in FIG. 1. Each respective corner 118 of the IC 102 are proximate a corresponding gap 120. The gap 120 may be defined by the surface of the IC 102 facing the PCB 104, the PCB 104, and one or more perimeter pads 114 proximate the respective corner 118 corresponding to the gap 120.

Figure 3:
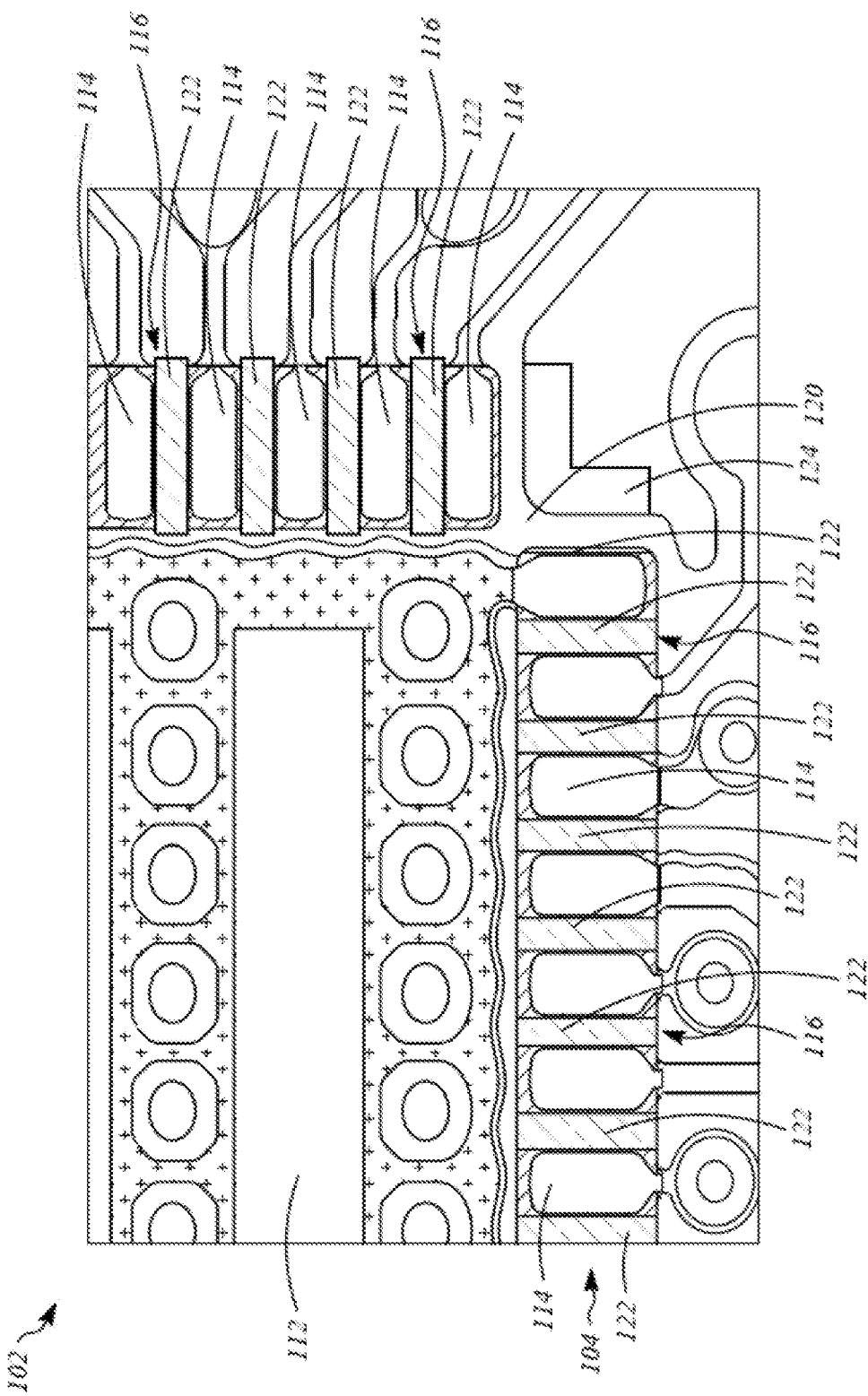
FIG. 3 generally illustrates a cutaway view between the integrated circuit and the printed circuit board of FIG. 2 including at least one conformal coating control surface feature.

During application of the conformal coating material, a portion of the conformal coating material may flow into the channels 116 and/or one or more gaps 120. The portion of conformal coating material may fill or partially fill the stand-off gap 106, the channels 116, and/or the gaps 120. This may accelerate solder fatigue of the solder connections between the IC 102 and the PCB 104 (e.g., due to physical expansion of the solder during thermal cycling). In order to control the flow of the conformal coating material (e.g., restrict, at least partially, the flow of conformal coating material into the stand-off gap 106, the channels 116, and/or the gaps 120) during application of the conformal coating material, the PCB 104 may include one or more surface features as is generally illustrated in FIG. 3.

In some embodiments, the surface features may include a solder mask material 122. The solder mask material 122 may include a thin lacquer-like layer of polymer or other suitable material. In some embodiments, the solder mask material 122 may be applied to all or substantially of respective gaps between respective pads on the PCB 104 corresponding to the perimeter pads 114 (e.g., before the IC 102 is brought into contact with the PCB 104 to define the channels 116). Additionally, or alternatively, the solder mask material 122 may be applied to a portion of the surface of the PCB 104 corresponding to respective gaps 120. When the IC 102 is seated onto the PCB 104 (e.g., brought into contact with the PCB 104), the solder mask material 122 may fill or substantially fill each respective channel 116 and/or each respective gap 120, as is generally illustrated in FIG. 3. The solder mask material 122, by filling or substantially filling each respective channel 116 and/or each respective gap 120 may reduce the stand-off gap 106 between the IC 102 and the PCB 104 (e.g., by filling or substantially filling space within the stand-off gap 106).

Solder is then applied to the PCB 104 and the IC 102 in order to electrically connect the IC 102 to the PCB 104. When the solder is applied to the PCB 104, solder flux residue accumulates proximate the solder mask material 122 that is applied to the PCB 104. The conformal coating material is then applied to the PCB 104 and the IC 102. The solder flux residue accumulated proximate the solder mask material 122 blocks the flow of conformal coating material and prevents, at least some, of the conformal coating material from flowing into the channels 116 and/or the gaps 120.

Figure 4:
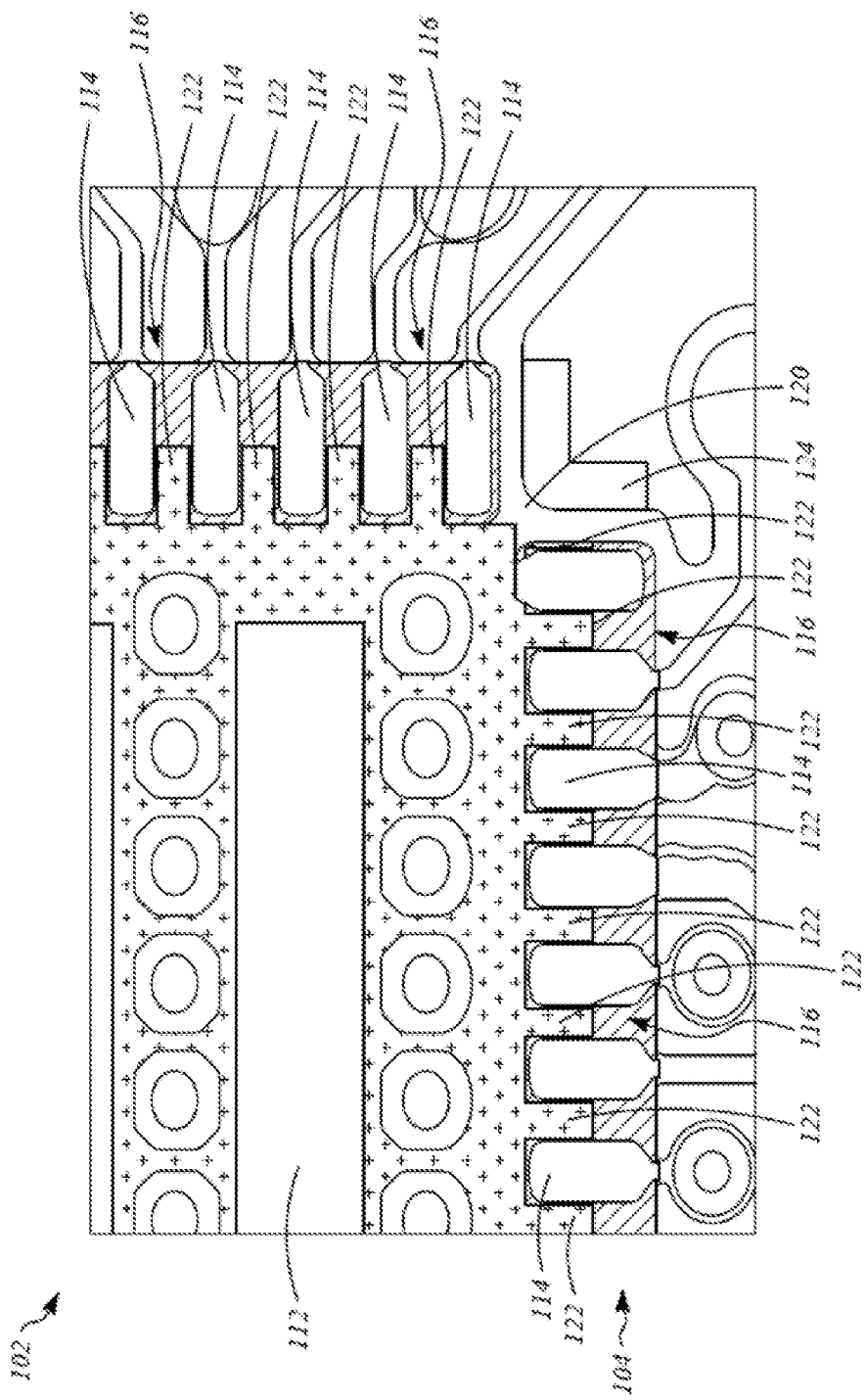
FIG. 4 generally illustrates a cutaway view between the integrated circuit and the printed circuit board of FIG. 2 including at least one conformal coating control surface feature.

In some embodiments, the solder mask material 122 may be applied a portion of the respective gaps between respective pads on the PCB 104 corresponding to the perimeter pads 114 (e.g., before the IC 102 is brought into contact with the PCB 104 to define the channels 116). Additionally, or alternatively, the solder mask material 122 may be applied to a portion of the surface of the PCB 104 corresponding to respective gaps 120. When the IC 102 is seated onto the PCB 104, the solder mask material 122 may partially fill each respective channel 116 and/or each respective gap 120, as is generally illustrated in FIG. 4. The solder mask material 122, by filling or substantially filling each respective channel 116 and/or each respective gap 120, may reduce the stand-off gap 106 between the IC 102 and the PCB 104 (e.g., by filling or substantially filling space within the stand-off gap 106).

When the solder is applied to the PCB 104, solder flux residue accumulates proximate the solder mask material 122 that is applied to the PCB 104. The conformal coating material is then applied to the PCB 104 and the IC 102. The solder flux residue accumulated proximate the solder mask material 122 partially blocks the flow of conformal coating material and prevents, at least some, of the conformal coating material from flowing into the channels 116 and/or the gaps 120, while allowing, at least some, of the conformal coating material to flow into a portion of the channels 116 and/or the gaps 120 not blocked by the solder flux residue.

In some embodiments, the solder mask material 122 may fill or substantially fill some of the channels 116 and may partially fill others of the channels 116. In some embodiments, the solder mask material 122 may fill or substantially fill some of the channels 116 and not others of the channels 116. In some embodiments, the solder mask material 122 may partially fill some of the channels 116 and not others of the channels 116.

In some embodiments, as is generally illustrated in FIGS. 3 and 4, the surface features may include a solderable member 124 attached to the surface of the PCB 104. The solderable member 124 may include a solderable land and may comprise any suitable material, such as copper, zinc, brass, or other suitable solderable material. The solderable member 124 may include a straight member, a curved member, an angled member, or other suitable solderable member. For example, the solderable member 124 may include an angled bracket such as a 90☐ or substantially 90☐-angled bracket, or other suitable angled bracket.

In some embodiments, one or more solderable members 124 may be disposed on the surface of the PCB 104 proximate respective corners 118 of the IC 102. For example, solderable members 124 may be attached to portions of the PCB 104 (e.g., before the IC 102 is brought into contact with the PCB 104, defining the gaps 120) corresponding to respective corners 118 of the IC 102. The PCB 104 may include one solderable member 124, two solderable members 124, three solderable members 124, four solderable members 124, or any suitable number of solderable members 124. In some embodiments, the PCB 104 may include one or more solderable members 124 disposed proximate any other portion of the IC 102 other than the corners 118 and/or a combination of other portions of the IC 102 and one or more of the corners 118 of the IC 102.

When the solder is applied to the PCB 104, solder flux residue accumulates proximate the solderable members 124 disposed on the PCB 104. The conformal coating material is then applied to the PCB 104 and the IC 102. The solder flux residue accumulated proximate the solderable members 124 blocks the flow of conformal coating material and prevents, at least some, of the conformal coating material from flowing into the respective gaps 120 (e.g., gaps 120 corresponding to solderable members 124 disposed on the PCB 104).

In some embodiments, the PCB 104 may include a combination of solder mask material 122 and one or more solderable members 124. When the solder is applied to the PCB 104, solder flux residue accumulates proximate the solder mask material 122 applied to the PCB 104 and proximate solderable members 124 disposed on the PCB 104. The conformal coating material is then applied to the PCB 104 and the IC 102. The solder flux residue accumulated proximate the solder mask material 122 and the solderable members 124 blocks the flow of conformal coating material and prevents, at least some, of the conformal coating material from flowing into the channels 116 having solder mask material 122 partially or substantially filled with solder mask material 122 and the gaps 120 corresponding the solderable members 124 disposed on the PCB 104. It should be understood that the PCB 104 may include any combination of any amount of solder mask material 122 and any number of solder members 124.

Figure 5:
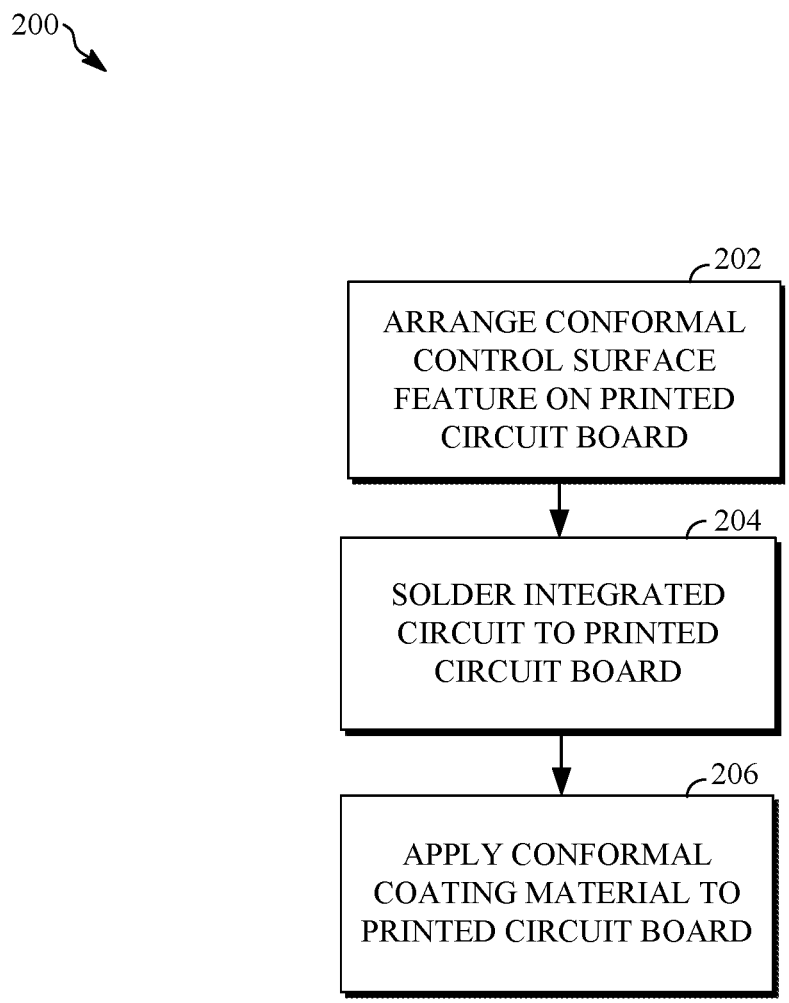
FIG. 5 is a flow diagram generally illustrating a conformal coating control method according to the principles of the present disclosure.

FIG. 5 is a flow diagram generally illustrating a conformal coating control method 200 according to the principles of the present disclosure. At 202, the method 200 arranges at least one conformal control surface feature on a printed circuit board. As described, the conformal control surface feature may include solder mask material 122 (e.g., applied to various portions of the PCB 104 corresponding to perimeter pads 114 of the IC 102 and/or respective gaps 120) one or more solder members 124, or a combination thereof. In some embodiments, the solder mask material 122 may partially fill or substantially fill the all of the channels 116, partially fill some of the channels 116 and substantially fill others of the channels 116, partially fill some of the channels 116 and not fill others of the channels 116, substantially fill some of the channels 116 and not fill others of the channels 116, or any combination thereof. In some embodiments, the PCB 104 may include any suitable number of solderable members 124 disposed proximate respective corners 118 of the IC 102 and/or proximate other suitable portions of the IC 102. In some embodiments, the PCB 104 includes any suitable combination of solder mask material 122 and solderable members 124.

At 204, the method 200 solders an integrated circuit to the printed circuit board. As described, the IC 102 is soldered to the PCB 104. When the IC 102 is soldered to the PCB 104, solder residue flux accumulates proximate the conformal control surface features applied to the PCB 104. At 206, the method 200 applies conformal coating material to the printed circuit board. As described, conformal coating material is applied to the IC 102 and the PCB 104. When the conformal coating material is applied to the IC 102 and the PCB 104, the solder flux residue accumulated proximate the conformal control surface features at least partially blocks or controls the flow of conformal coating material, such that the conformal coating material is restricted from flowing into the channels 116 and/or the gaps 120.

In some embodiments, a conformal coating control method includes arranging at least one conformal control surface feature on a surface of a printed circuit board proximate perimeter pads of an integrated circuit. The method also includes soldering, to the printed circuit board, the integrated circuit. The method also includes applying a conformal coating material to the printed circuit board, wherein the conformal coating material is at least partially restricted from flowing between the integrated circuit and the printed circuit board by solder flux residue accumulated proximate the conformal control surface feature.

In some embodiments, the at least one conformal control surface feature includes a solder mask material. In some embodiments, the perimeter pads of the integrated circuit define channels between the integrated circuit and the printed circuit board. In some embodiments, the solder mask material partially fills at least some of the channels defined by the perimeter pads of the integrated circuit. In some embodiments, the solder mask material partially fills each of the channels defined by the perimeter pads of the integrated circuit. In some embodiments, the at least one conformal control surface feature includes at least one solderable member arranged proximate the perimeter pads of the printed circuit board and proximate a corner of the integrated circuit. In some embodiments, the at least one solderable member includes a 90 degree angle bracket. In some embodiments, the integrated circuit includes a quad-flat no-leads package.

In some embodiments, a system for conformal coating control includes a printed circuit board and an integrated circuit disposed on a surface of the printed circuit board, wherein a solder mask material is disposed on the surface of the printed circuit board proximate perimeter pads of the integrated circuit. The system also includes at least one solderable member disposed on the printed circuit board proximate the integrated circuit. The system also includes a conformal coating material that is applied to the printed circuit board, wherein the conformal coating material is at least partially restricted from flowing between the integrated circuit and the printed circuit board by solder flux residue accumulated proximate of the solder mask material and the at least one solderable member.

In some embodiments, the solder mask material reduces a stand-off gap height between the integrated circuit and the printed circuit board. In some embodiments, the perimeter pads of the integrated circuit define channels between the integrated circuit and the printed circuit board. In some embodiments, the solder mask material partially fills at least some of the channels defined by the perimeter pads of the integrated circuit. In some embodiments, the solder mask material partially fills each of the channels defined by the perimeter pads of the integrated circuit. In some embodiments, the at least one solderable member is arranged proximate a corner of the integrated circuit. In some embodiments, the at least one solderable member includes a 90 degree angle bracket. In some embodiments, the integrated circuit includes a quad-flat no-leads package.

In some embodiments, a conformal coating control method includes applying a solder mask material into channels on a printed circuit board defined by an integrated circuit. The method also includes arranging, on the printed circuit board and proximate a corner of the integrated circuit, a solderable member. The method also includes soldering, to the printed circuit board, the integrated circuit, wherein soldering the integrated circuit to the printed circuit board causes solder flux residue to accumulate proximate the solder mask material and the solderable member. The method also includes applying a conformal coating material to the printed circuit board, wherein the conformal coating material is at least partially restricted, by the solder flux residue, from flowing between the integrated circuit and the printed circuit board.

In some embodiments, the solder mask material reduces a stand-off gap height between the integrated circuit and the printed circuit board. In some embodiments, the solderable member includes a 90 degree angle bracket. In some embodiments, the integrated circuit includes a quad-flat no-leads device.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A conformal coating control method, comprising:
   arranging a solder mask material on a surface of a printed circuit board in channels between contact portions of the printed circuit board that are configured to connect to corresponding perimeter pads of an integrated circuit,
      wherein the solder mask material fills the channels and reduces a height of a stand-off gap in the channels between the integrated circuit and the printed circuit board, relative to a stand-off gap in the channels between the integrated circuit and the printed circuit board without the solder mask material, to a second height, and
      wherein the contact portions are located along a perimeter of the integrated circuit;
   soldering the integrated circuit to the printed circuit board using the contact portions of the printed circuit board and the corresponding perimeter pads of the integrated circuit;
   accumulating solder flux residue from the soldering on the solder mask material; and
   applying a conformal coating material to the integrated circuit and the printed circuit board,
      wherein the conformal coating material is partially restricted from flowing between the integrated circuit and the printed circuit board through the channels between the contact portions by the solder mask material and the accumulated solder flux residue, and
      wherein the flowing is permitted to only in a portion of the channels.

2. The method of claim 1, wherein the integrated circuit includes a quad-flat no-leads package.

3. The method of claim 1, wherein the conformal coating material is in a range from 25 micrometers to 40 micrometers.

4. The method of claim 1, wherein the conformal coating material is in a range from 200 micrometers to 250 micrometers.

5. A conformal coating control method, comprising:
   arranging a solder mask material on a surface between contact portions of a printed circuit board, the surface corresponding to channels between perimeter pads of an integrated circuit that are configured to connect to the corresponding contact portions,
      wherein the solder mask material fills the channels and reduces a height of a stand-off gap in the channels between the integrated circuit and the printed circuit board, relative to a stand-off gap in the channels between the integrated circuit and the printed circuit board without the solder mask material, to a second height, and
      wherein the contact portions are located along a perimeter of the integrated circuit;
   soldering the integrated circuit to the printed circuit board using a first solderable member included on the surface of the printed circuit board;
   accumulating solder flux residue from the soldering on the solder mask material; and
   applying a conformal coating material to the integrated circuit and the printed circuit board,
      wherein the conformal coating material is partially restricted from flowing between the integrated circuit and the printed circuit board through the channels between the contact portions by the solder mask material and the accumulated solder flux residue, and
      wherein the flowing is permitted to only in a portion of the channels.

6. The method of claim 5, wherein the integrated circuit includes a quad-flat no-leads device.

7. The method of claim 5, wherein the solder mask material fills all of the respective channels and physically connects the contact portions.

8. The method of claim 5, wherein the first solderable member is an angled bracket.

9. The method of claim 8, wherein the surface of the printed circuit board further includes a second solderable member, a third solderable member, and a fourth solderable member;
   wherein the first solderable member is located at a first corner of the integrated circuit, the second solderable member is located at a second corner of the integrated circuit, the third solderable member is located at a third corner of the integrated circuit, and the fourth solderable member is located at a fourth corner of the integrated circuit; and
   wherein the second solderable member is an angled bracket, the third solderable member is an angled bracket, and the fourth solderable member is an angled bracket.

10. The method of claim 9, wherein the conformal coating material is in a range from 200 micrometers to 250 micrometers.

11. A method comprising:
   applying a solder mask material to an area of a printed circuit board between a first contact portion and a second contact portion;
   soldering a first perimeter pad of an integrated circuit to the first contact portion and a second perimeter pad of the integrated circuit to the second contact portion:
   accumulating solder flux residue on the solder mask material; and
   applying a conformal coating material to the integrated circuit and the printed circuit board,
      wherein the conformal coating material is partially restricted from flowing through the area between the first contact portion and the second contact portion into a stand-off gap between the integrated circuit and the printed circuit board by the solder mask material and the solder flux residue, wherein a height of the stand-off gap without the solder mask material is defined by a distance between a surface of the printed circuit board and a surface of the integrated circuit facing the surface of the printed circuit board when the first perimeter pad and the second perimeter pad is connected to the first contact portion and the second contact portion respectively, and wherein the flowing is permitted to only in a portion of the channels.

* * * * *